(12) United States Patent
Heo et al.

(10) Patent No.: US 6,534,359 B2
(45) Date of Patent: *Mar. 18, 2003

(54) METHOD OF FABRICATING MEMORY CELL

(75) Inventors: Kuen-Chy Heo, Chiai Hsien (TW); Jeng-Ping Lin, Taoyuan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/854,590

(22) Filed: May 15, 2001

(65) Prior Publication Data

US 2001/0044188 A1 Nov. 22, 2001

(30) Foreign Application Priority Data

May 16, 2000 (TW) ........................................ 89109310 A

(51) Int. Cl.$^7$ .......................................... H01L 21/8242
(52) U.S. Cl. ........................ 438/243; 438/254; 438/386
(58) Field of Search ................................. 438/243, 246, 438/247, 254, 257, 386, 387, 388, 389, 390, 206

(56) References Cited

U.S. PATENT DOCUMENTS

| 4,958,318 | A | * | 9/1990 | Harari .......................... 365/149 |
| 6,184,091 | B1 | * | 2/2001 | Gruening et al. ............ 438/270 |
| 6,204,140 | B1 | * | 3/2001 | Gruening et al. ............ 438/386 |
| 6,320,215 | B1 | * | 11/2001 | Bronner et al. .............. 257/301 |
| 6,331,459 | B1 | * | 12/2001 | Gruening ..................... 438/243 |
| 6,355,529 | B2 | * | 3/2002 | Heo et al. ..................... 438/270 |
| 6,359,299 | B1 | * | 3/2002 | Gruening ..................... 257/301 |
| 2001/0038113 | A1 | * | 11/2001 | Bronner et al. .............. 257/301 |
| 2001/0044189 | A1 | * | 11/2001 | Heo et al. ..................... 438/268 |
| 2001/0044190 | A1 | * | 11/2001 | Heo et al. ..................... 438/270 |

* cited by examiner

Primary Examiner—Matthew Smith
Assistant Examiner—Renzo N Rocchegiani
(74) Attorney, Agent, or Firm—Birch, Stewart, Kolasch & Birch, LLP

(57) ABSTRACT

A method of fabricating a vertical transistor of a memory cell is disclosed. Accordinng to this method, a semiconductor substrate is first provided. A pad layer is formed on the surface of the substrate. A deep trench is formed in the substrate. In the deep trench, a trench capacitor is formed, a collar oxide layer is then formed on the sidewalls above the trench capacitor. A first conductive layer is formed above the trench capacitor. A second conductive layer is deposited to form a buried strap and an opening. A first insulating layer and a second masking layer are formed and fill the opening. The pad layer, the substrate, the second masking layer, the first insulating layer, the collar oxide layer and the first conductive layer are patterned. A second insulating layer is deposited and forms a Shallow Trench Isolation. A portion of the second masking layer is removed. The pad layer is removed to expose the substrate. A well is formed in the exposed substrate after forming a third insulating layer. The third insulating layer and the first insulating layer are then removed. The second masking layer is removed. A fourth insulating layer is deposited to form the gate oxide. Sequentially, a third and a fourth conductive layers are deposited to form the gate. Finally, the source/drain regions and the gate spacers are formed to complete the fabrication of the vertical transistor of a memory cell.

25 Claims, 13 Drawing Sheets

METHOD OF FABRICATING MEMORY CELL

BACKGROUND OF THE INVENTION

1. Field of the Invention

The present invention relates to a method of fabricating memory cell with transistor, and more particularly to a dynamic random access memory (DRAM) cell having a vertical transistor.

2. Description of the Prior Art

A DRAM cell comprises a metal-oxide-semiconductor field effect transistor (MOSFET) and a capacitor that are built in a semiconductor silicon substrate. There is an electrical contact between the drain of a MOSFET and the bottom storage electrodes of the adjacent capacitor, forming a memory cell of the DRAM device. A large number of memory cells make up the cell arrays which combine with the peripheral circuit to produce DRAMs.

In recent years, the sizes of the MOSFETs have continuously shrunk so that the packing densities of these DRAM devices have increased considerably. For example, new techniques for manufacturing extremely small transistor elements have been developed for 1 Giga bit DRAMs and beyond. One of the methods of increasing integration is to form a three-dimensional transistor structure, instead of the commonly used planar-type transistor.

Referring to FIG. 1A, a semiconductor substrate 100 is provided. A pad oxide layer 102 is formed on the substrate 104 by using an oxidation process. Then, a pad nitride layer 106 and a BPSG layer (not shown) are formed by LPCVD process on the pad oxide 102. The BPSG layer, the pad nitride layer 106, the pad oxide layer 102 and the substrate 100 are defined to form a deep trench 112 by photolithography and etching process. Then, the BPSG layer is removed. At the lower portion of the trench 112, a trench capacitor (not shown) is formed by using conventional process. Then, a thin collar oxide layer 114 is formed on the sidewalls of the upper portion of the deep trench 112 that are above the trench capacitor. A polysilicon layer 116 is formed and fills up the inner space of the deep trench 112.

Referring to FIG. 1B, the polysilicon layer 116 is etched back until the surface of the polysilicon layer 116 in the deep trench 112 is lower than the surface of the substrate 104. Then, the collar oxide layer 114 over the top surface of the polysilicon 116 is over-etched until the top of the collar oxide layer 114 is lower than the top surface of the polysilicon layer 116.

Referring to FIG. 1C, a doped polysilicon layer (not shown) is deposited on the surface of the pad nitride layer 106 and fills the inner space of the deep trench 112. The doped polysilicon layer on the pad nitride layer 106 is removed by a Chemical Mechanical Polishing (CMP) process. The pad nitride layer 106 acts as an etching stop layer while removing the doped polysilicon layer. Then, the doped polysilicon in the deep trench 112 is etched back until the top surface of the doped polysilicon in the deep trench 112 is lower than the surface of the substrate 104 at a predetermined distance. The residual doped polysilicon layer in the deep trench 112 forms the buried strap 122.

Referring to FIG. 1D, an anti-reflection coating (ARC) layer 124 is deposited on the pad nitride layer 106 and fills the inner space of the deep trench 112. A photoresist layer 126 is coated on the anti-reflection coating layer 124, and then a first opening 128 is defined and formed on the photoresist layer 126 by photolithography.

Referring to FIG. 1E, an opening 130 is formed by anisotropically etching away the anti-reflection coating layer 124, the pad nitride layer 106, the oxide layer 102, the buried strap 122, the collar oxide layer 114, the first conductive layer 116 and substrate 100. The photoresist layer 126 and the residual ARC layer 124 are then removed.

Referring to FIG. 1F, the opening 130 is filled with an insulating layer (not shown) which may be composed of high density plasma oxide. The pad nitride layer 106, the pad oxide layer 102 and a portion of the insulating layer are planarized by a CMP process, and then the pad nitride layer 106 and the pad oxide layer 102 are removed by an etch-back process. Thus the insulating layer in the opening 130 forms the shallow trench isolation (STI) 136. The impurities contained in the buried strap 122 out-diffuse into the substrate 100 to form the source region 131 because of the high temperature during the mentioned manufacturing processes.

Referring to FIG. 1G, a polysilicon layer (not shown), a tungsten silicide layer (not shown) and a nitride layer (not shown) are sequentially deposited on the surface of the substrate 100 and STI 136. Then, the gates 145 and the second word lines 138 are formed on the surface of the substrate 100 and STI 136 by defining the polysilicon layer, the tungsten silicide layer and the nitride layer by photolithography and anisotropic etching. A drain region 125 is formed by using the gates 145 as the mask and implanting N type dopants into the substrate 100. Thus, the manufacturing of a memory cell with a vertical transistor is completed.

Since the packing density of the DRAM increases and the sizes of the transistors and capacitors continuously scale down, the distance between the source region 131 and the drain region 125 is shortened. Accordingly, the source region 131 tends to overlap with the drain region 125 in the conventional manufacturing process, causing that the gates 145 loss the switching function and the device always turns on. That is, the memory device can not work.

SUMMARY OF THE INVENTION

Accordingly, the primary object of the present invention is to provide a method of fabricating a memory cell having a vertical transistor, which can prevent the drain region and the source region from short-circuiting.

According to this invention, a new method of fabricating the semiconductor with a vertical transistor is set forth. The vertical transistor is fabricated in the trench instead of on the surface of the substrate. The gate is located in the trench and extends to the surfaces of the substrate and the shallow trench isolation. The source region and the drain region are then fabricated perpendicularly to each other, and will not overlap with each other. The depth of trench and the location of the gate can be controlled to avoid the overlap of the source region and the drain region.

In order to achieve the above object, this invention provides a method of fabricating a vertical transistor of a memory cell, which is described below. A semiconductor substrate is first provided. A pad layer is formed on the substrate. Then, a deep trench is formed in the substrate. A trench capacitor is formed at the lower portion of the deep trench. A collar oxide layer is formed on the sidewalls of the upper portion of the deep trench that is above trench capacitor. A first conductive layer is formed above said trench capacitor and is etched to a first predetermined depth in said deep trench. A portion of the collar oxide layer above the first conductive layer is removed to form a first opening. A second conductive layer is formed to fill the first opening.

An etch-back process is performed to remove a portion of the second conductive layer to a second predetermined depth and have a second opening formed thereon. The residual second conductive layer forms a buried strap. A first insulating layer is formed on the pad layer and extends into the deep trench to cover the sidewalls and bottom of the second opening. Then, a second masking layer is formed on the first insulating layer and fills the inner space of the second opening. A planarization process is performed to remove the portion of the second masking layer and the first insulating layer. The pad layer, the substrate, the second masking layer, the first insulating layer, the collar oxide layer and the first conductive layer are patterned to a third predetermined depth to form a third opening. A second insulating layer is formed to fill the inner space of the third opening. An etching process is performed to remove a portion of the second insulating layer and thus forms a Shallow Trench Isolation. Next, an etch-back process is performed to remove a portion of the second masking layer to a fourth predetermined depth and have a fourth opening formed thereon. Then, the pad layer is removed to expose the surface of the substrate. A third insulating layer is formed on the exposed surface of the substrate and the surface of the second masking layer in the fourth opening. A well is formed at the upper portion of the substrate. The third insulating layer and the first insulating layer covering the substrate in the fourth opening are removed simultaneously while the first insulating layer and the second masking layer are remained on the buried strap. Then, the second masking layer on the bottom of the fourth opening is removed. A fourth insulating layer is formed on the surface of the substrate and on the sidewalls of the fourth opening. The portion of the fourth insulating layer on the top surface of the substrate is removed to form the gate oxide. Sequentially, a third conductive layer and a fourth conductive layer are formed to fill the fourth opening and cover the surface of both the substrate and the shallow trench isolation. Then, the third conductive layer and the fourth conductive layer are defined to form the gate. Finally, the source/drain regions and the gate spacers are formed to complete the fabrication of the vertical transistor of a memory cell.

BRIEF DESCRIPTION OF THE DRAWINGS

The accompanying drawings form a material part of this description, in which.

DETAILED DESCRIPTION OF THE PREFERRED EMBODIMENT

The invention disclosed herein directed to a method of fabricating the vertical transistor of DRAMs. In the following description, numerous details are set forth in order to provide a thorough understanding of the present invention. It will be appreciated by ones skilled in the art that variations of these specific details are possible while still achieving the results of the present invention. Well-known processing steps are not described in detail in order not unnecessarily to obscure the present invention.

Figure 1A:
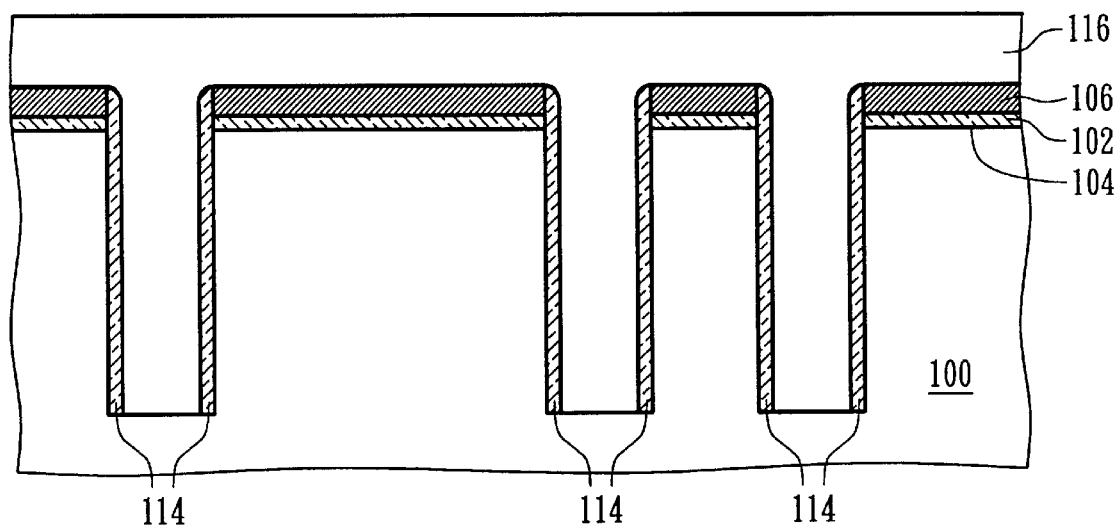
FIGS. 1A through 1G show schematic cross-sectional views of a partially fabricated integrated circuit structure at successive stages in forming a transistor of a DRAM cell of the prior art.
Figure 1B:
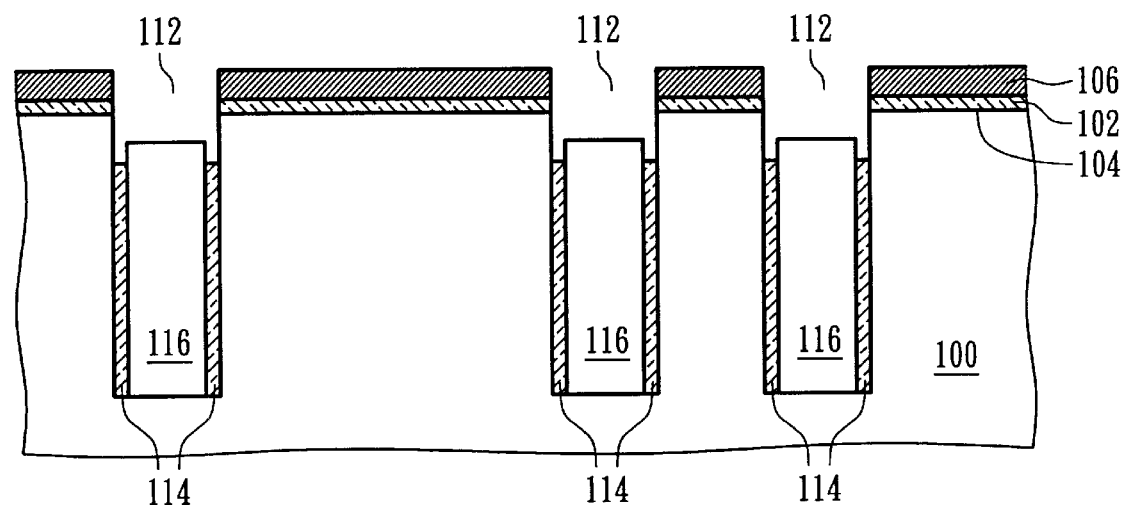
Figure 1C:
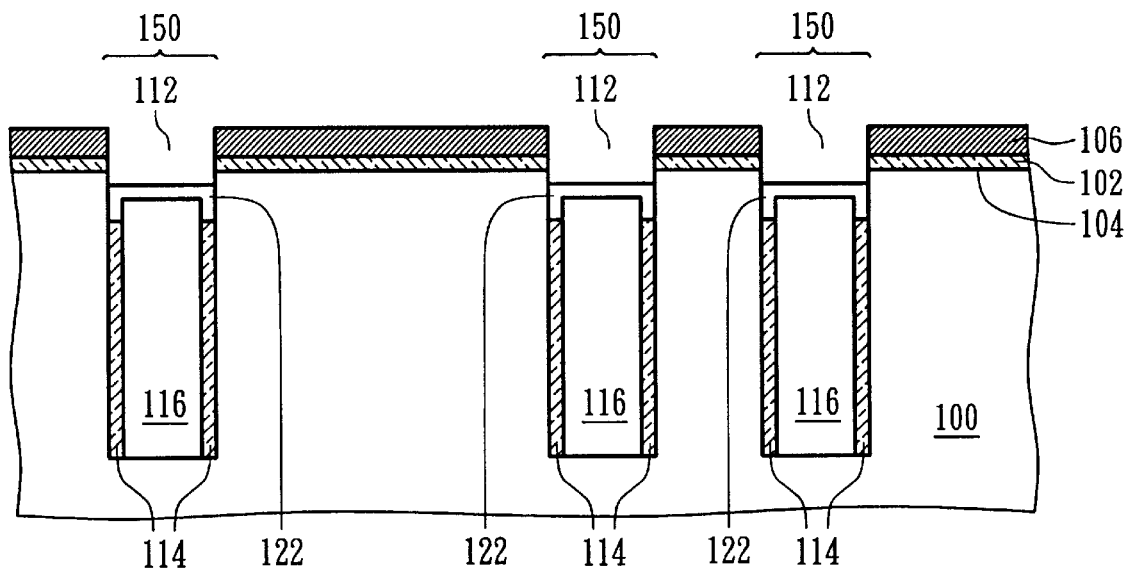
Figure 1D:
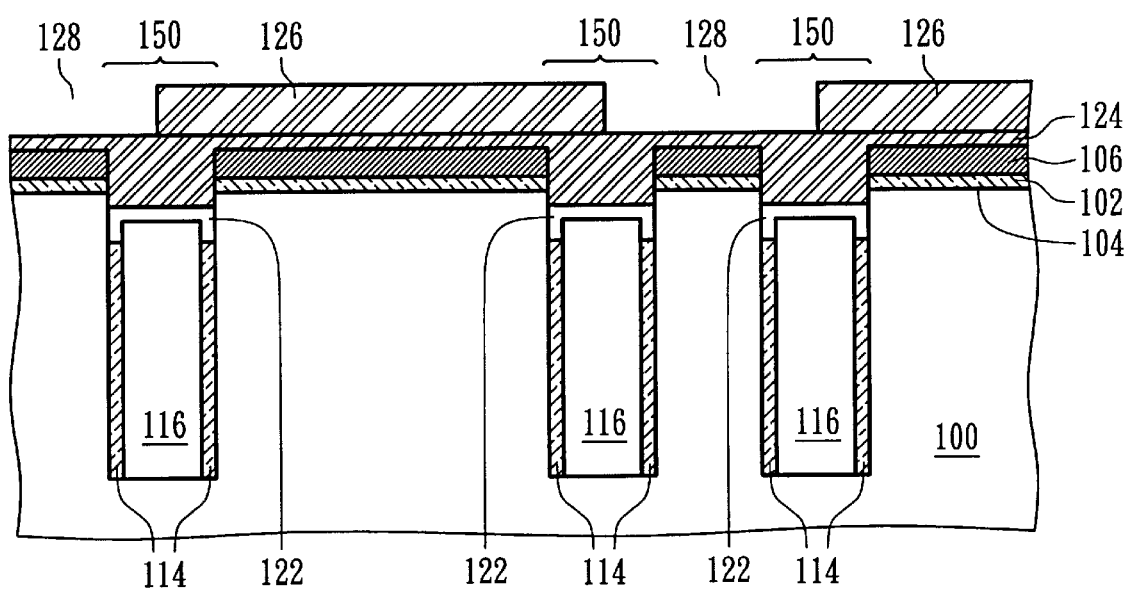
Figure 1E:
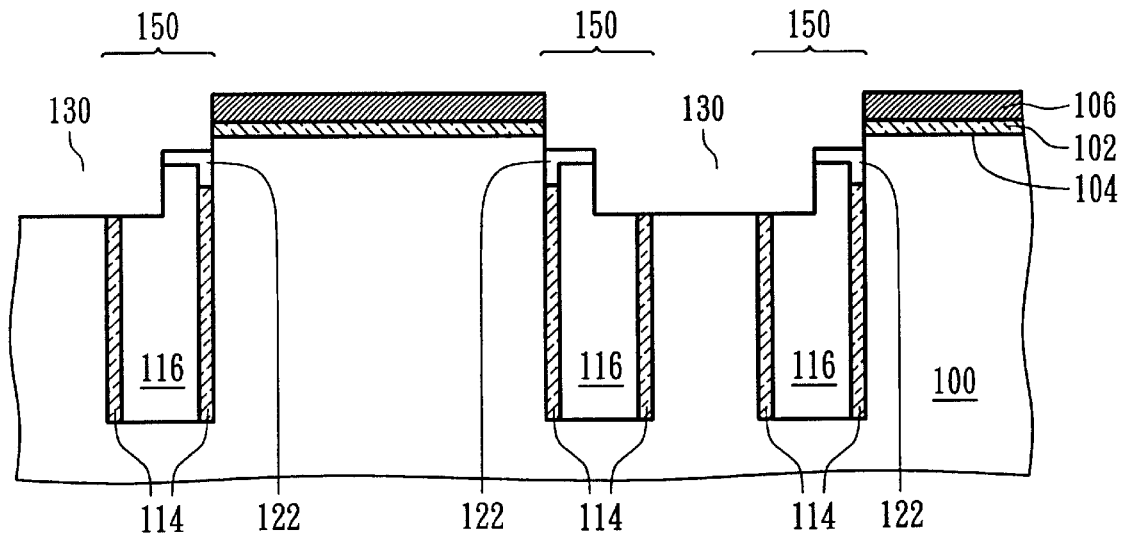
Figure 1F:
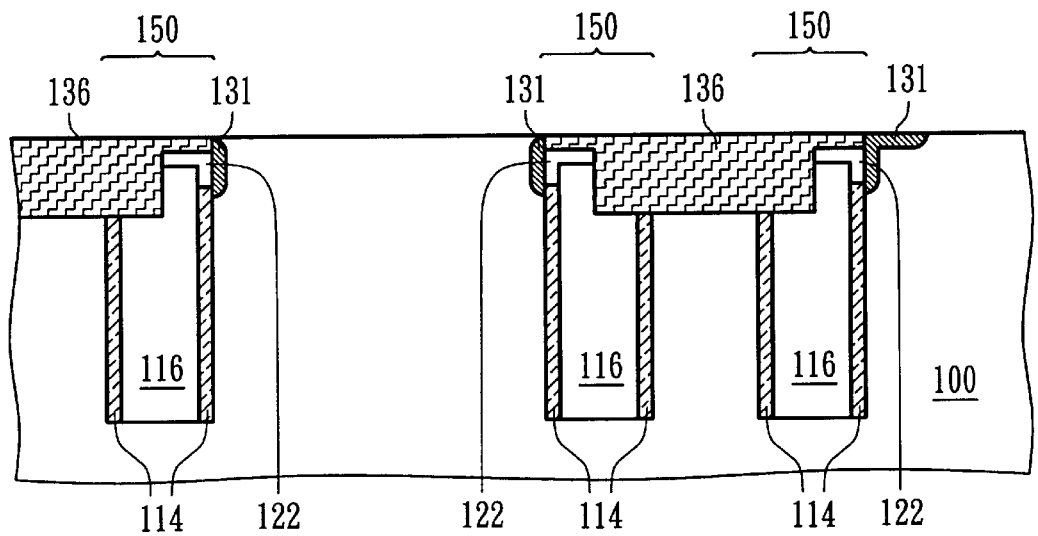
Figure 1G:
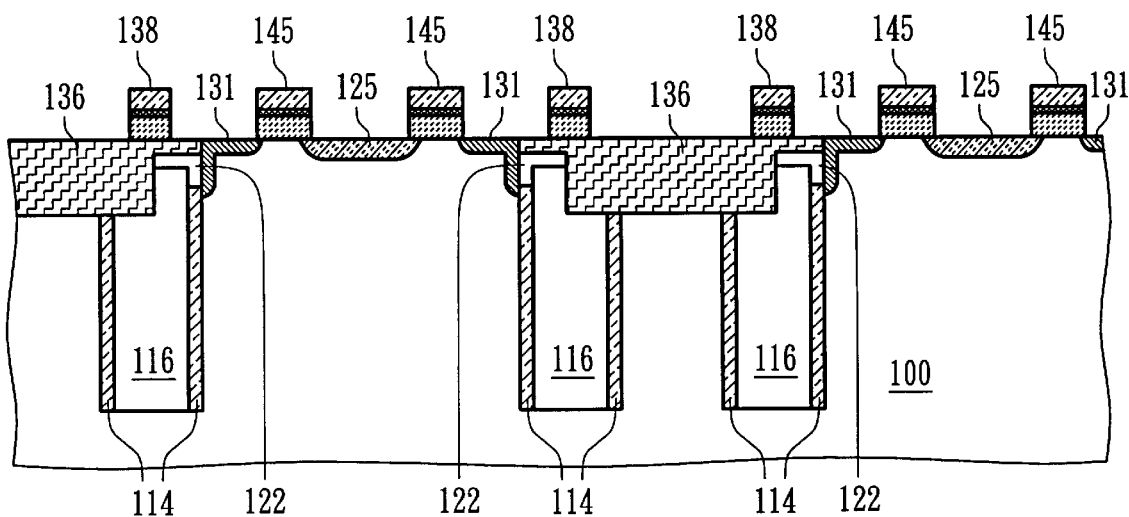
Figure 2A:
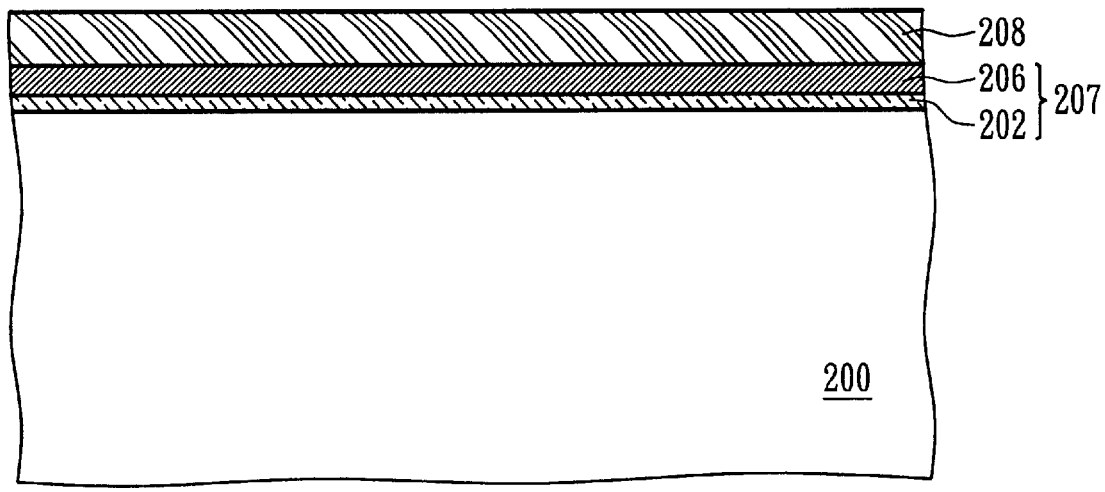
FIGS. 2A through 2R show schematic cross-sectional views of a partially fabricated integrated circuit structure at successive stages in forming a vertical transistor of a DRAM cell according to an embodiment of the present invention.

Referring now to FIG. 2A, a semiconductor substrate 200 is provided. The semiconductor substrate 200 is composed of silicon or germanium. The substrate 200 can be made by epitaxial silicon or silicon on insulator (SOI). For simplicity, a P-type semiconductor silicon substrate 200 is taken as an example in this invention. An oxidation process is used to form a pad oxide layer 202 on the surface of the substrate 204. The thickness of the pad oxide layer 202 is about 150 angstroms. A pad nitride layer 206 is then formed over the pad oxide 206 by CVD process. The thickness of the pad nitride layer 206 is about 1500 to 3000 angstroms. The pad oxide 202 and the pad nitride 206 compose the pad layer 207. A first masking layer 208 is formed over the pad layer 207. The first masking layer 208, which has a thickness of about 5000 to 20000 angstroms, is composed of boron silicate glass (BSG) by situ doped boron ions in silicate glass. The first masking layer 208 can be formed by CVD, APCVD, SAPCVD, LPCVD, PECVD or HDPCVD technique. Thereafter, the first masking layer 208 is planarized by thermal reflow, etch-back or chemical mechanical polishing (CMP) techniques.

Figure 2B:
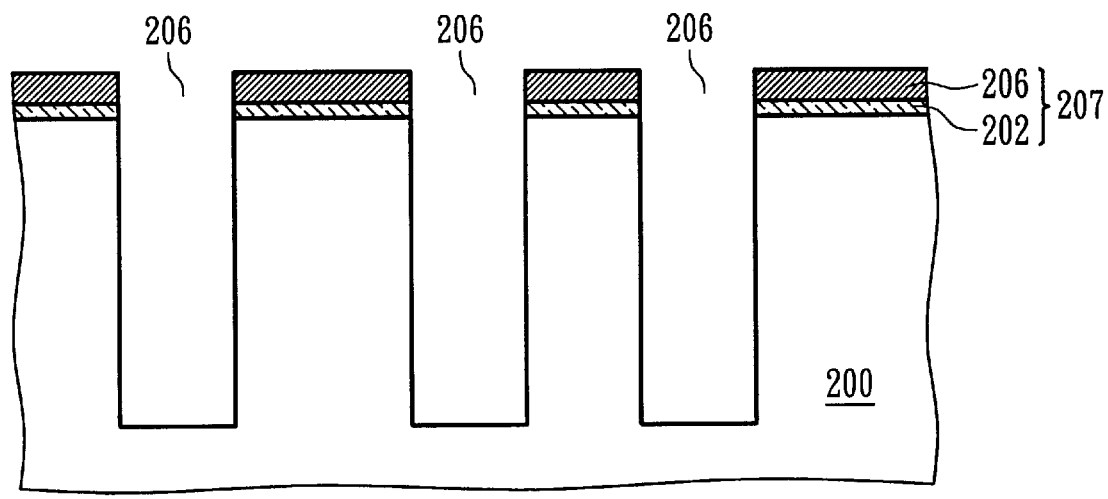

Referring to FIG. 2B, the first masking layer 208 is defined by photolithography and etching. Then, by using the first masking layer 208 as a mask, the pad layer 207 and the substrate 200 are patterned to form a deep trench 212 on the substrate 200. After the formation of the deep trench 212, the first masking layer 208 is removed by an isotropic etching process, in which the pad layer 207 is used as an etching stop layer. Then, a trench capacitor 250 (not shown) is formed at the lower portion of the deep trench 212 by conventional processes.

Figure 2C:
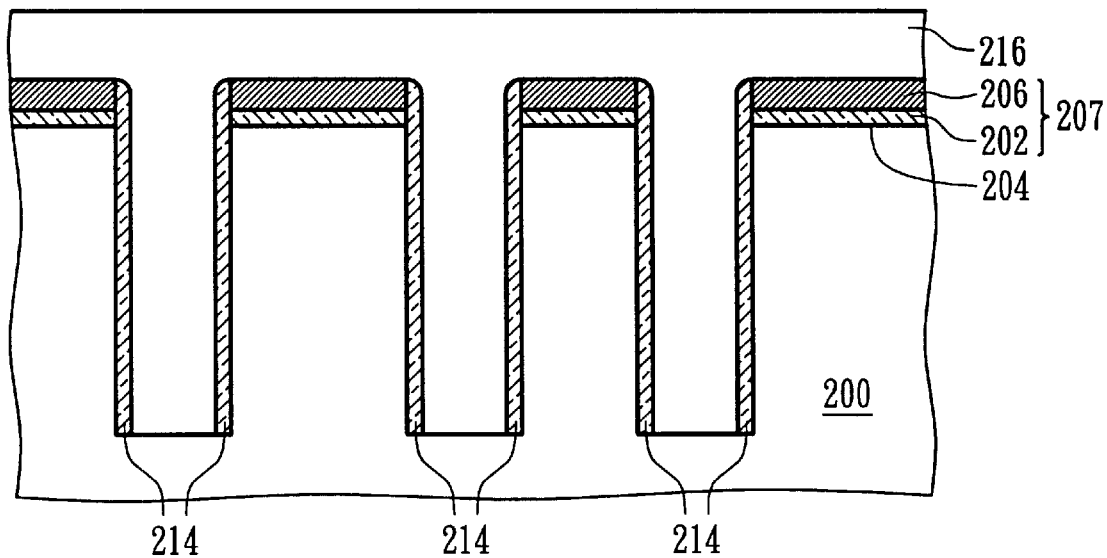

Referring to FIG. 2C, a collar oxide layer 214 is formed on the sidewalls of the upper portion of the deep trench 212 that is above the trench capacitor. The collar oxide layer 214 can be composed of silicon oxide formed by CVD technique. The thickness of the collar oxide layer 214 is about 200 to 1000 angstroms. Then, a first conductive layer 216 is formed on the pad layer 207 and fills the deep trench 212. The first conductive layer 216, which has a thickness of 2500 to 4000 angstroms, is usually composed of polysilicon doped with arsenic ions or phosphorus ionsand can be formed by LPCVD technique with diffusion process, ion implantation or in-situ doped process.

Figure 2D:
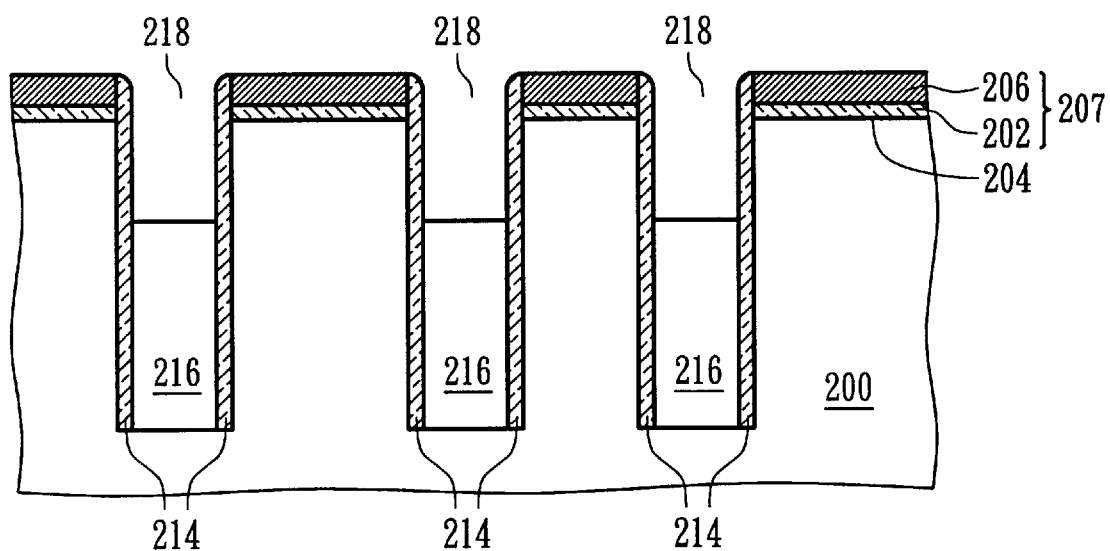

Referring to FIG. 2D, using the pad layer 207 as the stop layer, the first conductive layer 216 above the pad layer 207 is removed by using a planarization process, such as the chemical mechanical polishing (CMP) technique. Then, an etch-back process is performed to remove a portion of the first conductive layer 216 in the deep trench 212 to a first predetermined depth to form a first opening 218. The top surface of the residual first conductive layer 216 is lower than the surface of the substrate 204. The first predetermined depth is 2500 to 5500 angstroms beneath the surface of the substrate.

Figure 2E:
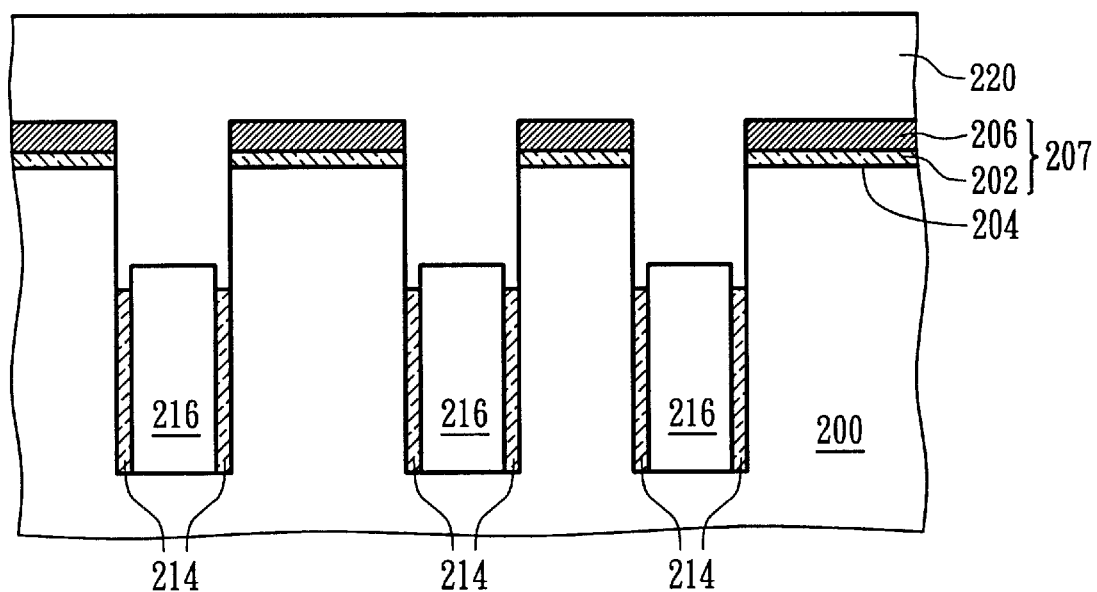

Referring to FIG. 2E, a portion of the collar oxide layer 214 is removed by using an over-etching process until the top surface of the collar oxide layer 214 is lower than the top surface of the first conductive layer 216. A second conductive layer 220 is formed on the surface of the pad layer 207 and fills the inner space of the first opening 218. The second conductive layer 220 is composed of polysilicon doped with arsenic ions or phosphors ions, which can be formed by the LPCVD technique with diffusion process, ion implantation or in-situ doped process. The second conductive layer 220 has a thickness of 2500 to 4000 angstroms.

Figure 2F:
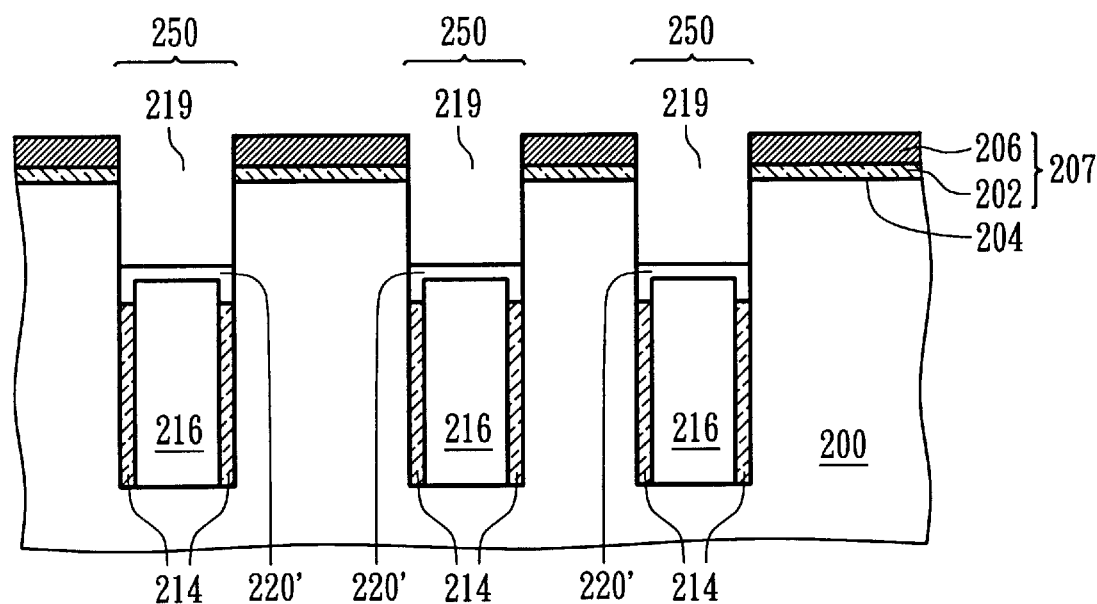

Referring to FIG. 2F, using the pad layer 207 as the stop layer, the second conductive layer 220 above the pad layer 207 is removed by performing a planarization process such as CMP. Then, an etch-back process is performed to remove a portion of the second conductive layer 220 to a second predetermined depth and the residual second conductive layer 220 forms a buried strap 220'. The second predetermined depth is about 2000 to 5000 angstroms beneath the surface of the substrate 204. Then, the inner space of the deep trench 212 above the buried strap 220' is the second opening 219.

Figure 2G:
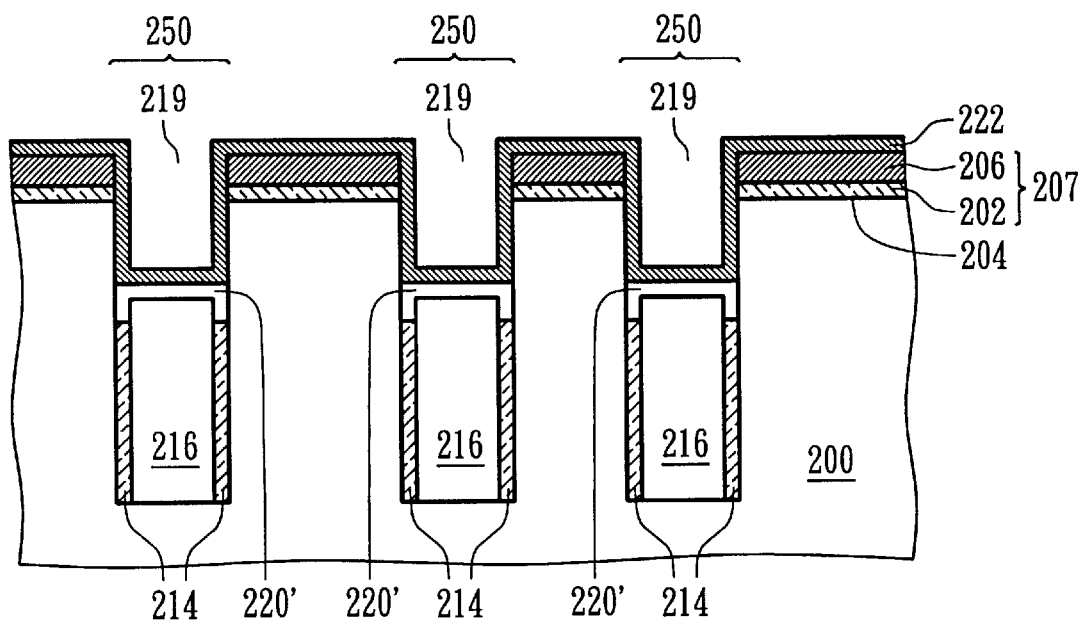

Referring to FIG. 2G, a first insulating layer 222 is formed on the pad layer 207. The first insulating layer 222 extends into the deep trench 212 and covers the sidewalls and bottom of the second opening 219. The first insulating layer 222 is composed of High Density Plasma Oxide layer formed by High Density Plasma Chemical Vapor Deposition (HDPCVD) technique or silicon oxide layer formed by CVD technique, and has a thickness of 250 to 650 angstroms.

Figure 2H:
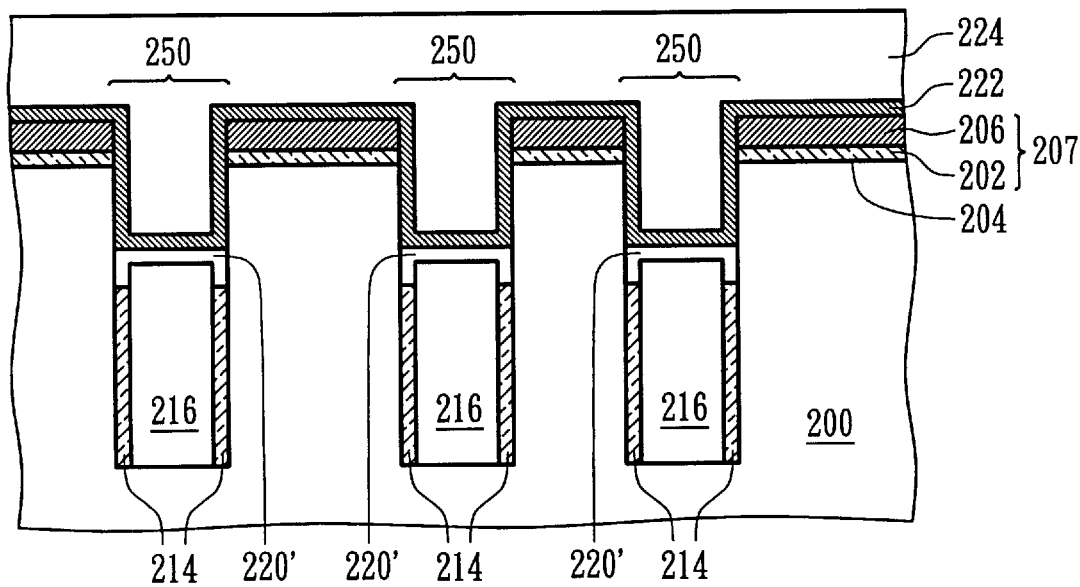

Referring to FIG. 2H, a second masking layer 224 is formed over the first insulating layer 222 and fills the inner space of the second opening 219. The second masking layer 224, which has a thickness of 2500 to 4000 angstroms, is made of polysilicon deposited by LPCVD.

Figure 2I:
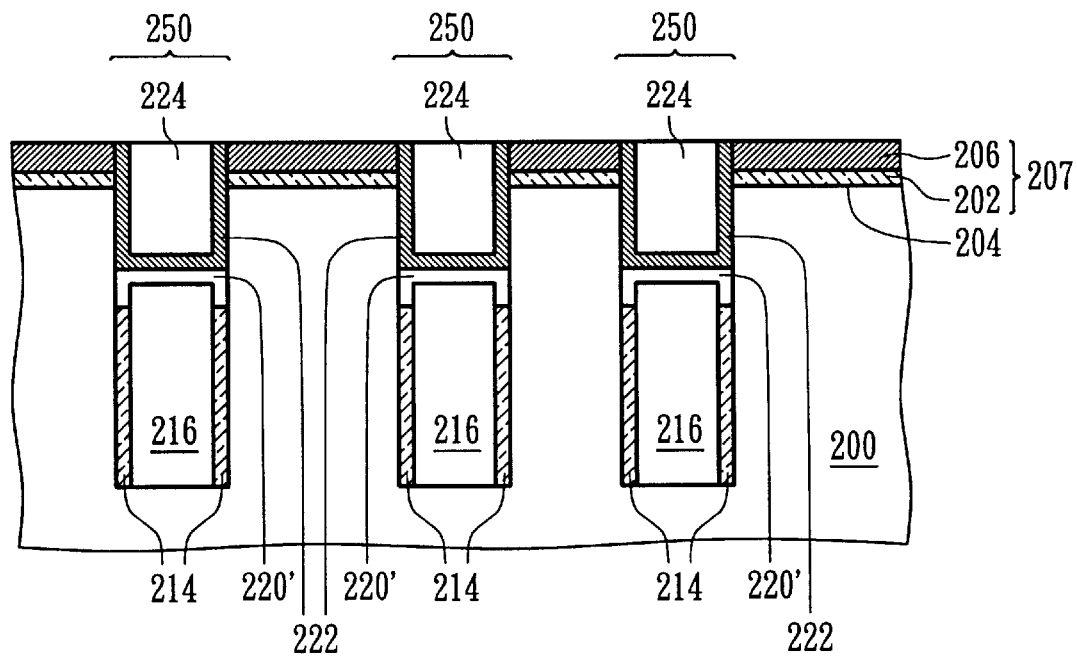

Referring to FIG. 2I, a planarization process, such as the CMP process, is performed to remove the portion of the second masking layer 224 and the first insulating layer 222 that are on the pad layer 207. The pad layer 207 is used as the stop layer for the planarization process.

Figure 2J:
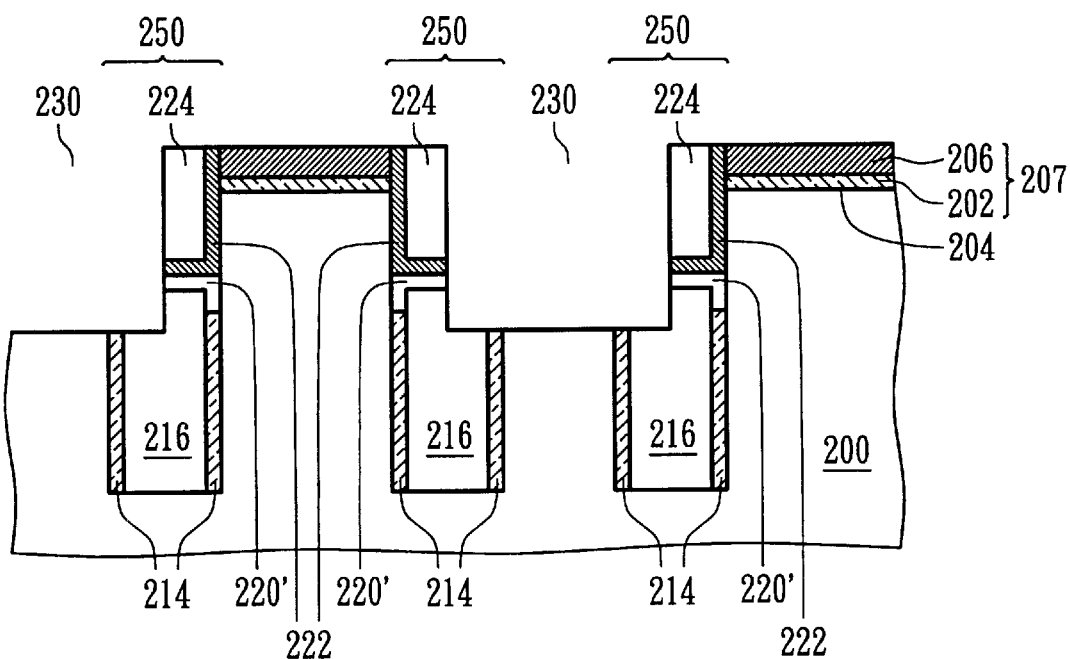

Referring to FIG. 2J, the pad layer 207, the substrate 200, the second masking layer 224, the first insulating layer 222, the collar oxide layer 214 and the first conductive layer 216 are defined to a third predetermined depth to form a third opening 230. The third predetermined depth is about 3000 to 6000 angstroms beneath the surface 204 of the substrate.

Figure 2K:
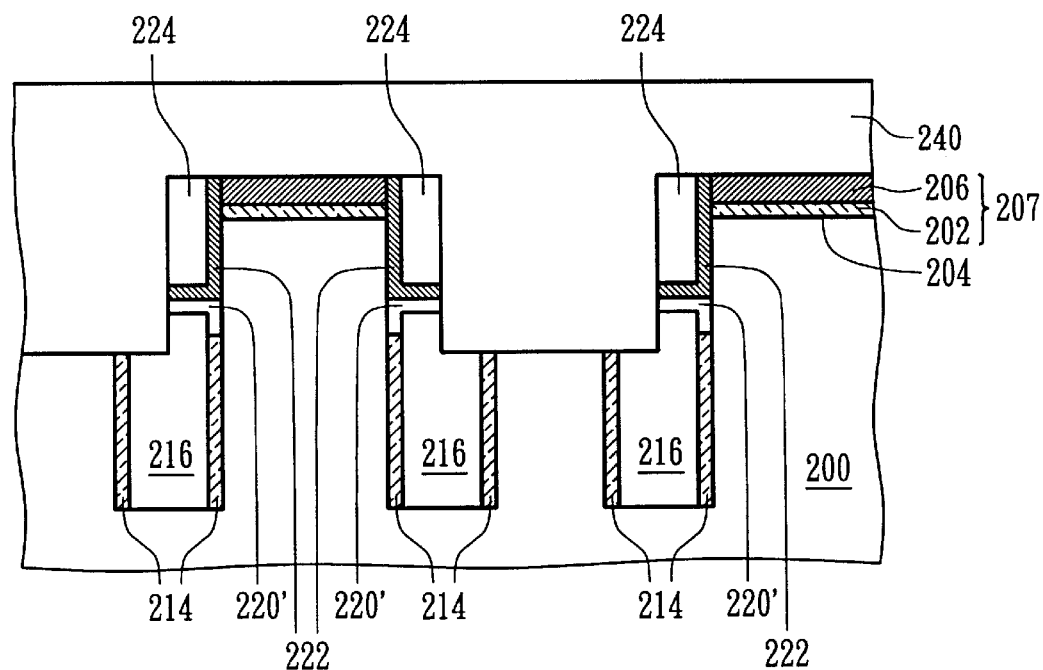

Referring to FIG. 2K, a second insulating layer 240 is formed to cover the pad layer 207, the second masking layer 224 and the first insulating layer 222, and fills the third opening 230. The second insulating layer 240, which has a thickness of 4000 to 7000 angstroms, is composed of High Density Plasma Oxide layer formed by High Density Plasma Chemical Vapor Deposition (HDPCVD) technique or silicon oxide layer formed by CVD technique.

Figure 2L:
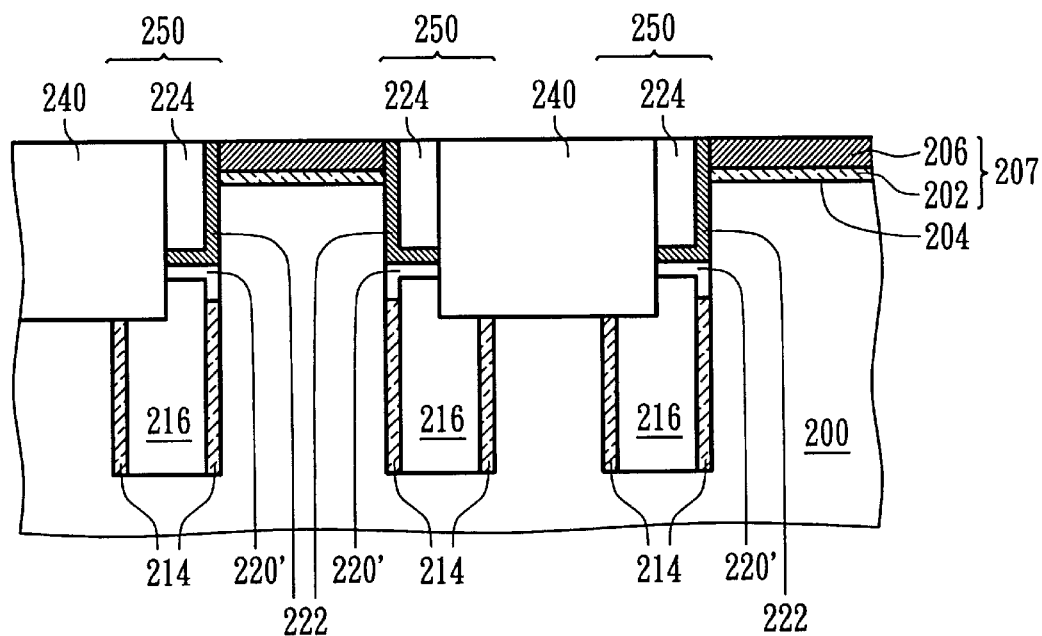

Referring to FIG. 2L, a planarization process, such as the CMP process, is performed to remove the second insulating layer 240, in which the pad layer 207, the second masking layer 224 and the first insulating layer 222 are served as the stop layer for the planarization process.

Figure 2M:
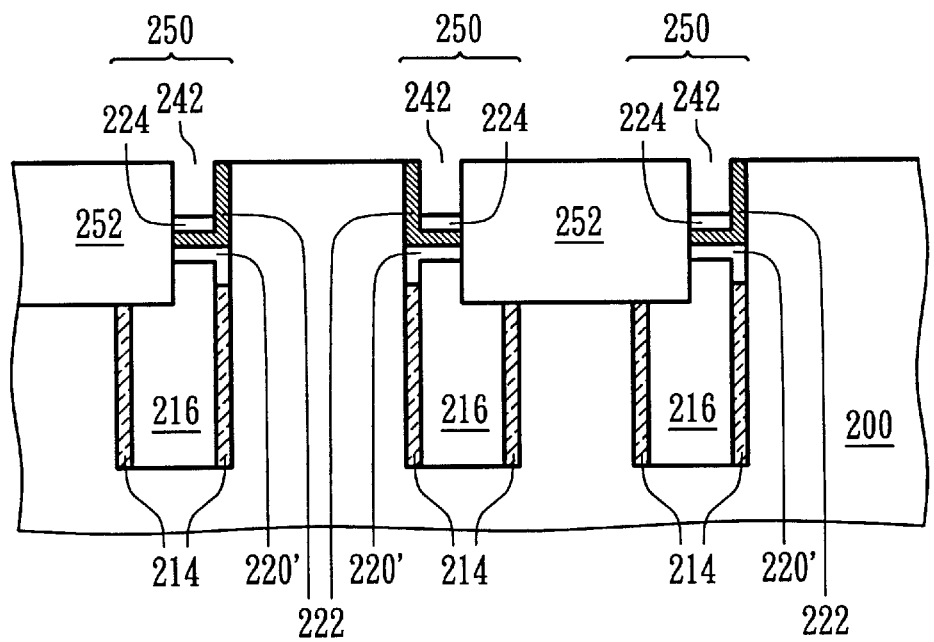

Referring to FIG. 2M, an isotropic etching process is performed to remove a portion of the second insulating layer 240 and forms the Shallow Trench Isolation 252. Then, an etch-back process is performed to partially remove the second masking layer 224 to a fourth predetermined depth to form a fourth opening 242. The fourth predetermined depth is about 2000 to 5000 angstroms beneath the surface of the substrate 204. Next, the pad layer 207 is removed by etching to expose the surface of the substrate 204. The etching process can be an isotropic etching process.

Figure 2N:
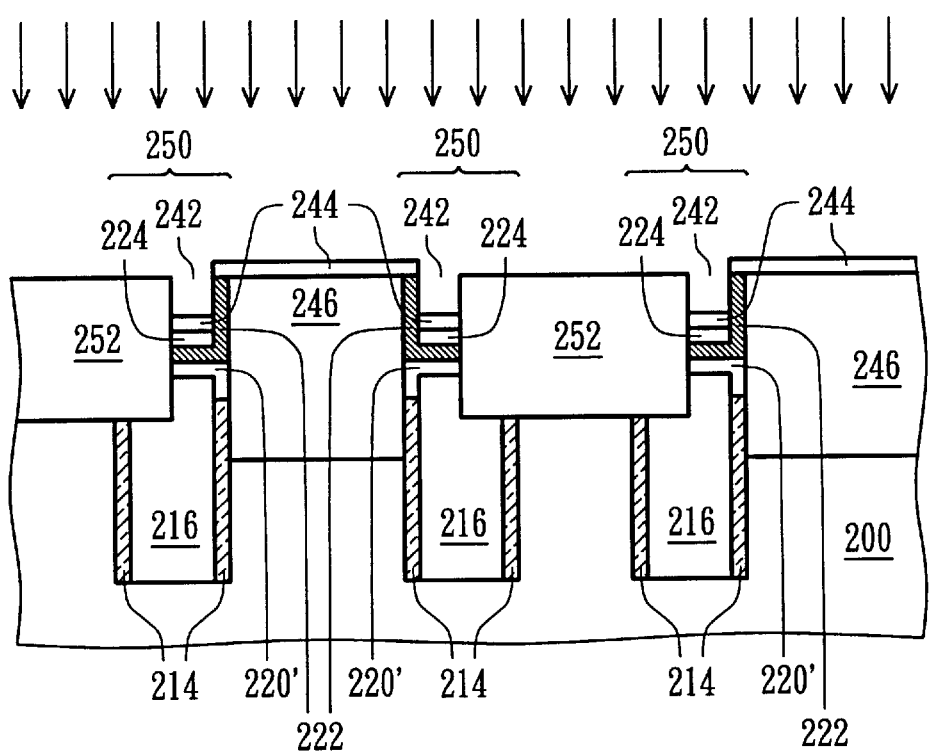

Referring to FIG. 2N, a third insulating layer 244 is formed on the exposed surface 204 of the substrate 200 and the surface of the second masking layer 224 in the fourth opening 242. The third insulating layer 244 is composed of thermal oxide layer formed by rapid thermal oxidation and has a thickness of 50 to 150 angstroms. Then, the conventional technique is used to dope some ions into the substrate 200 to form a well 246 at the upper portion of the substrate 200. The purpose of forming the third insulating layer 244 is to protect the surface 204 of the substrate 200 from being destroyed by the ion bombardment while forming the well 246. The other purpose of forming the third insulating layer 244 is to prevent the channeling effect from occurring on the surface 204 of the substrate 200 so that the depth and the ions concentration of implantation can be easily controlled.

Figure 2O:
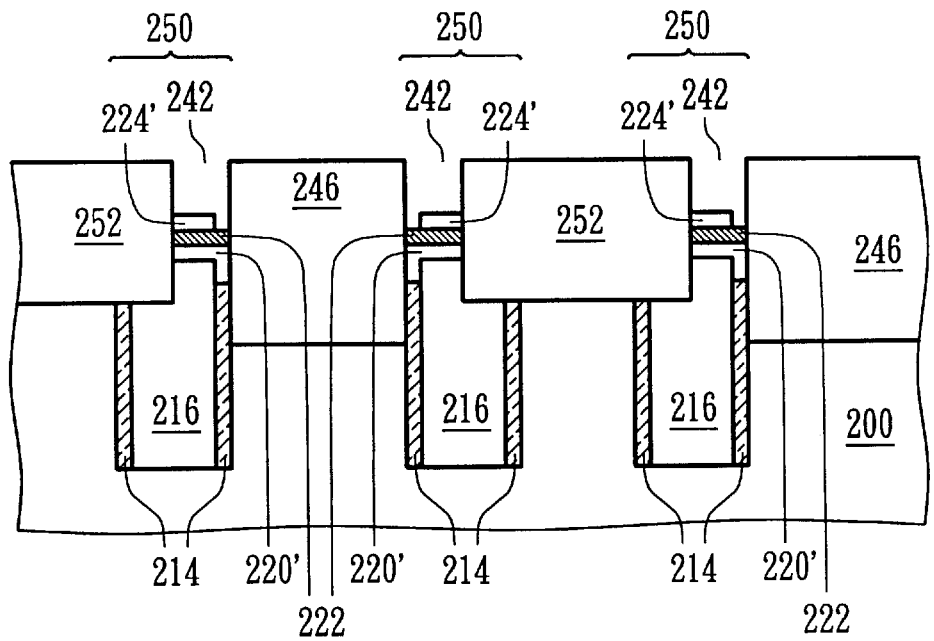

Referring to FIG. 2O, the third insulating layer 244 is removed by an etching process such as an isotropic etching process. In this step, the first insulating layer 222 covering the substrate 200 in the fourth opening 242 is removed simultaneously. The residual first insulating layer 222 and the second masking layer 224 are remaining on the buried strap 220'.

Figure 2P:
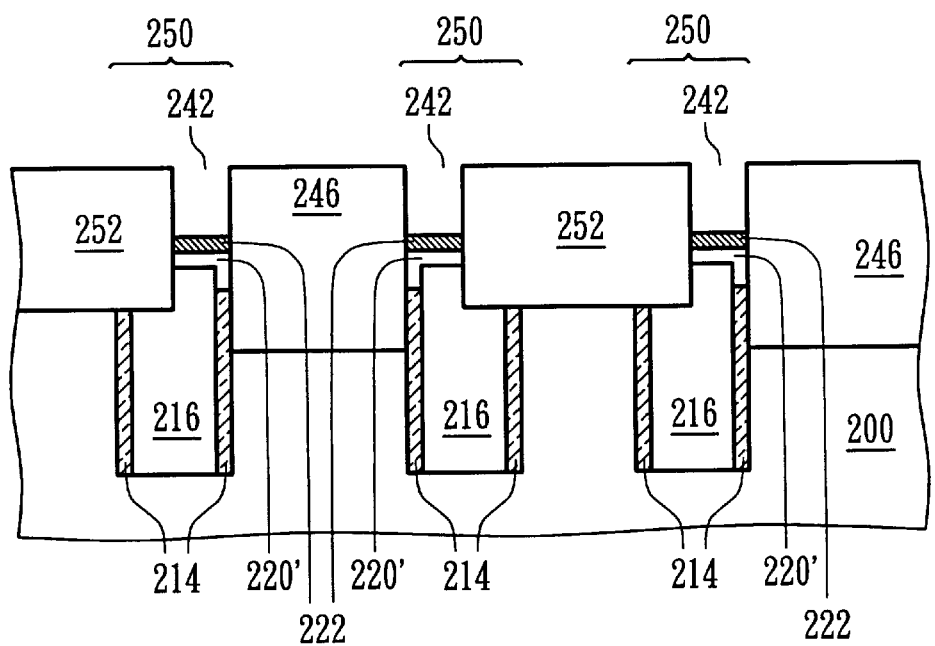

Referring to FIG. 2P, an etching process is performed to remove the second masking 224 on the bottom of the fourth opening 242. The etching process is isotropic in this embodiment.

Figure 2Q:
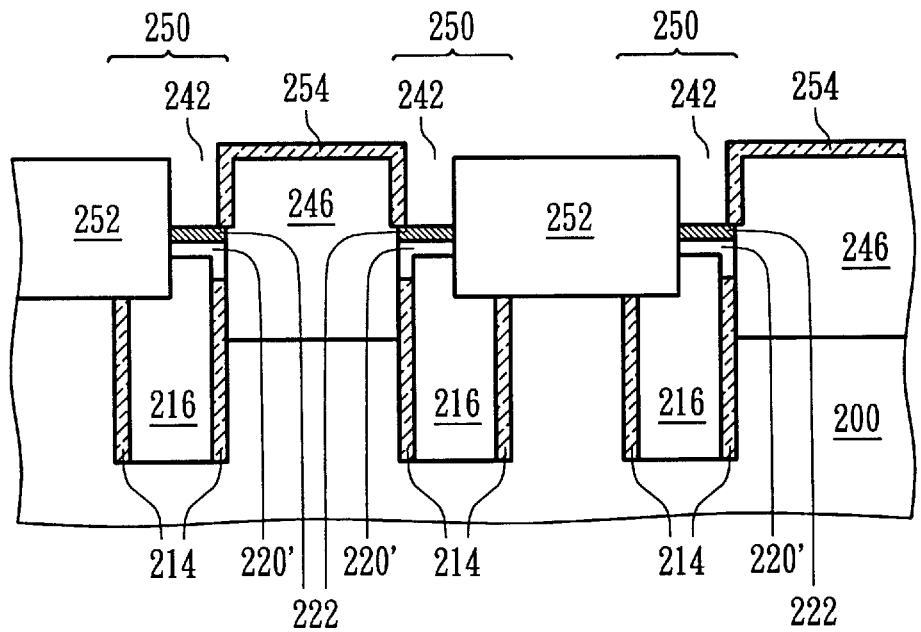

Referring to FIG. 2Q, a fourth insulating layer 254 is formed on the exposed surface of the substrate 200 in the well 246. The fourth insulating layer 254 is composed of a thermal oxide layer formed by a thermal oxidation. The fourth insulating layer 254 has a thickness of 50 to 150 angstroms.

Figure 2R:
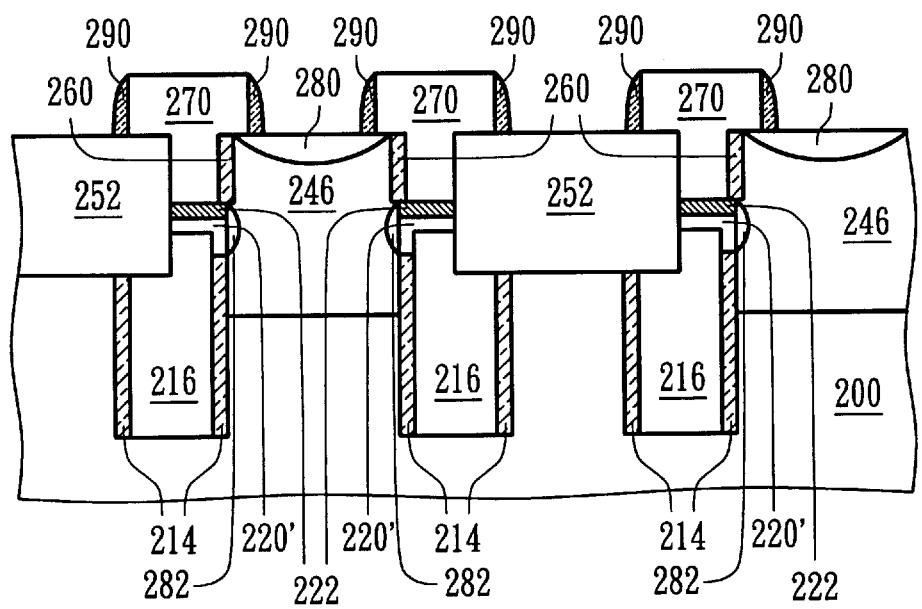

Referring to FIG. 2R, the fourth insulating layer 254 on the top surface of the substrate 200 in the well 246 is removed by an etching process. The fourth insulating layer 254 on the sidewall of the substrate 200 in the well 246 forms the gate oxide 260. The etching process is preferably an anisotropic etching process. Then, a third conductive layer (not shown) has a thickness of about 650 to 1000 angstroms and a fourth conductive layer (not shown) has a thickness of about 500 to 900 angstroms are formed to fill the fourth opening 242 and cover the surface of both the substrate in the well 246 and the Shallow Trench Isolation 252. The third conductive layer is composed of polysilicon formed by LPCVD and doped with arsenic ions or phosphorus ions by diffusion or implantation or in-situ ion doped techniques. The fourth conductive layer is composed of tungsten silicide that can be formed by CVD process. Afterwards, the third and fourth conductive layers are defined to form the gate 270. Portions of the third conductive layer and the fourth conductive layer on the surface of the substrate in the well 246 and Shallow Trench Isolation 240 are removed. A drain region 280 is formed by doping N-type dopants such as P or As into the substrate in the well 246 after the formation of the gate 270. The impurities contained in the buried strap 220' out-diffuse into the substrate 200 because of the high temperature of the mentioned processes and form the source region 282. The source region 282 is beneath the surface 204 of the substrate and is vertically to the drain region 280. The gate spacers 290 are formed on the sidewalls of the gate 270. The gate spacers 290 can be composed of silicon nitride or silicon oxide by CVD techniques.

It is to be understood that although the present invention has been described with reference to a particular preferred embodiment, it should be appreciated that numerous modifications, variations and adaptations may be made without departing from the scope of the invention as defined in the claims.

What is claimed is:

1. A method of fabricating memory cell with vertical transistor, comprising:

providing a semiconductor substrate;

forming a pad layer on the surface of the substrate;

forming a deep trench in the substrate;

forming a trench capacitor at the lower portion of the deep trench;

forming a collar oxide layer on sidewalls of the upper portion of said deep trench that is above said trench capacitor;

forming a first conductive layer above said trench capacitor and fills the deep trench;

etching said first conductive layer to a first predetermined depth in said deep trench to form a first opening;

removing a portion of said collar oxide layer above said first conductive layer;

forming a second conductive layer to fill said first opening, wherein the second conductive layer is doped polysilicon;

etching back said second conductive layer to a second predetermined depth to form a second opening, in which the residual second conductive layer forms a buried strap;

forming a first insulating layer conformally over said pad layer and the sidewalls and bottom of said second opening;

forming a second masking layer over said first insulating layer so that said second masking layer fills the inner space of said second opening;

performing a planarization process to remove portions of said second masking layer and said first insulating layer above said pad layer;

after the planarization process defining said pad layer, said substrate, said second masking layer, said first insulating layer, said collar oxide layer and said first conductive layer to a third predetermined depth to form a third opening;

forming a second insulating layer to fill said third opening;

removing a portion of said second insulating layer to form a Shallow Trench Isolation;

removing a portion of said second masking layer to a fourth predetermined depth and forming a fourth opening;

removing said pad layer to expose said surface of the substrate;

forming a third insulating layer on the exposed surface of said substrate and the surface of said second masking layer in said fourth opening;

forming a well at the upper portion of the substrate;

removing said third insulating layer and said first insulating layer covering said substrate in said fourth opening while said residual first insulating layer and said second masking layer are remained on said buried strap;

removing said second masking layer on the bottom of said fourth opening;

forming a fourth insulating layer on the surface of said substrate and on the sidewalls of the fourth opening;

removing the portion of said fourth insulating layer on the top surface of said substrate to form a gate oxide;

sequentially forming a third conductive layer and a fourth conductive layer to fill the fourth opening and cover the surface of both the substrate and the shallow trench isolation;

defining the third conductive layer and the fourth conductive layer to form a gate;

doping a dopant into the substrate in the well to form a source or drain region;

out-diffusing the dopant contained in the second conductive layer into the substrate in the well to form a source or drain region; and forming gate spacers.

2. The method of claim 1, wherein the semiconductor substrate is a silicon substrate.

3. The method of claim 1, wherein the pad layer is composed of a pad nitride layer and a pad oxide layer.

4. The method of claim 1, wherein said first conductive layer is composed of polysilicon doped with arsenic ions or phosphorus ions.

5. The method of claim 1, wherein said first conductive layer has a thickness of 2500 to 4000 angstroms.

6. The method of claim 1, wherein said second conductive layer is composed of polysilicon doped with arsenic ions or phosphorus ions.

7. The method of claim 1, wherein said second conductive layer has a thickness of 2500 to 4000 angstroms.

8. The method of claim 1, wherein said first predetermined depth is 2500 to 5500 angstroms beneath the surface of the substrate.

9. The method of claim 1, wherein said second predetermined depth is 2000 to 5000 angstroms beneath the surface of the substrate.

10. The method of claim 1, wherein said third predetermined depth is 3000 to 6000 angstroms beneath the surface of the substrate.

11. The method of claim 1, wherein said fourth predetermined depth is 2000 to 5000 angstroms beneath the surface of the substrate.

12. The method of claim 1, wherein said first insulating layer is composed of HDP (High Density Plasma) oxide.

13. The method of claim 1, wherein said first insulating layer as a thickness of 250 to 650 angstroms .

14. The method of claim 1, wherein said second masking layer is composed of polysilicon layer.

15. The method of claim 1, wherein said second masking layer has a thickness of 2500 to 4000 angstroms.

16. The method of claim 1, wherein said second insulating layer is composed of a material selected from the group consisting of oxide layer and High Density Plasma Oxide layer.

17. The method of claim 1, wherein said second insulating layer has a thickness of 4000 to 7000 angstroms.

18. The method of claim 1, wherein said third insulating layer is composed of thermal oxide layer formed by rapid thermal oxidation process.

19. The method of claim 1, wherein said third insulating layer has a thickness of 50 to 150 angstroms.

20. The method of claim 1, wherein said fourth insulating layer is composed of thermal oxide formed by thermal oxidation process.

21. The method of claim 1, wherein said fourth insulating layer has a thickness of 50 to 150 angstroms.

22. The method of claim 1, wherein the third conductive layer is made of doped polysilicon.

23. The method of claim 1, wherein said third conductive layer has a thickness of about 650 to 1000 angstroms.

24. The method of claim 1, wherein said fourth conductive layer has a thickness of about 500 to 900 angstroms.

25. The method of claim 1, wherein the step of etching the first conductive layer to a first predetermined depth is the only etching of the first conductive layer.

* * * * *